(12) United States Patent
Wang et al.

(10) Patent No.: US 10,804,946 B2
(45) Date of Patent: Oct. 13, 2020

(54) LOW POWER WAKE-UP RECEIVER

(71) Applicant: The Regents of the University of California, Oakland, CA (US)

(72) Inventors: Po-Han Wang, La Jolla, CA (US); Haowei Jiang, La Jolla, CA (US); Drew Hall, La Jolla, CA (US); Patrick Mercier, La Jolla, CA (US)

( * ) Notice: Subject to any disclaimer, the term of this patent is extended or adjusted under 35 U.S.C. 154(b) by 0 days.

(21) Appl. No.: 16/194,676

(22) Filed: Nov. 19, 2018

(65) Prior Publication Data
US 2019/0158133 A1 May 23, 2019

Related U.S. Application Data

(60) Provisional application No. 62/588,038, filed on Nov. 17, 2017.

(51) Int. Cl.
| H04B 1/16 | (2006.01) |
| H03F 3/19 | (2006.01) |
| H03K 4/50 | (2006.01) |
| H03K 3/0231 | (2006.01) |
| H03K 3/011 | (2006.01) |

(52) U.S. Cl.
CPC ............ *H04B 1/1615* (2013.01); *H03F 3/19* (2013.01); *H03K 4/50* (2013.01); *H03F 2200/06* (2013.01); *H03F 2200/102* (2013.01); *H03F 2200/451* (2013.01); *H03K 3/011* (2013.01); *H03K 3/0231* (2013.01)

(58) Field of Classification Search
CPC combination set(s) only.
See application file for complete search history.

(56) References Cited

U.S. PATENT DOCUMENTS 10,141,495 B1* 11/2018 Nordquist ............ H01L 41/107
2017/0126263 A1* 5/2017 Rinaldi ................... H04B 1/18

OTHER PUBLICATIONS

N. E. Roberts and D. D. Wentzloff, "A 98 nW wake-up radio for wireless body area networks," in RFIC Symp., Jun. 2012, pp. 373-376.
S. Oh et al., "A 116 nW multi-band wake-up receiver with 31-bit correlator and interference rejection," in Proc. CICC, Sep. 2013.
N. E. Roberts et al., "A 236nW-56.5dBm-sensitivity bluetooth low-energy wakeup receiver with energy harvesting in 65nm CMOS," in ISSCC Dig. Tech. Papers, Feb. 2016, pp. 450-451.
H. Jiang et al., "A 4.5nW Wake-Up Radio with -69dBm Sensitivity," in ISSCC Dig. Tech. Papers, Feb. 2017, pp. 416-417.

(Continued)

*Primary Examiner* — Junpeng Chen
(74) *Attorney, Agent, or Firm* — Greer, Burns & Crain, Ltd.; Steven P. Fallon

(57) ABSTRACT

A low-power wake-up receiver. The receiver includes a transformer/filter resonating at a pre-selected frequency to realize passive RF voltage gain. A pseudo-balun envelope detector is coupled to an output of the transformer filter. A comparator or other quantizer is coupled to an output of the active pseudo-balun envelope detector (ED) for comparing the ED output to a comparison threshold voltage. The pseudo-balun envelop detector can be an active detector. The pseudo-balun detector can also be a passive detector.

18 Claims, 9 Drawing Sheets

(56) References Cited

OTHER PUBLICATIONS

S.-E. Chen et al., "A 4.5 μW 2.4 GHz Wake-Up Receiver Based on Complementary Current-Reuse RF Detector," in Proc. ISCAS, May 2015, pp. 1214-1217.
X. Huang et al., "Noise and sensitivity in RF envelope detection receivers," IEEE Trans. Circuits Syst. II, Exp. Briefs, vol. 60, No. 10, pp. 637-641, Oct. 2013.

* cited by examiner

PERFORMANCE COMPARISON OF STATE-OF-THE-ART SUB-10 μW WuRXs

| | [1] RFIC'12 | [5] ISCAS'15 | [3] ISSCC'16 | [4] ISSCC'17 | [2] CICC'13 | This Work |
|---|---|---|---|---|---|---|
| Technology | 130 nm | 180 nm | 65 nm | 180 nm | 130 nm† | 180 nm |
| Supply Voltage | 1.2 V | 0.8 V | 1 / 0.5 V | 0.4 V | 1.2 / 0.5 V | 0.4 V |
| Data Rate | 100 kbps | 100 kbps | 8.192 kbps | 0.3 kbps | 12.5 kbps | 0.3 kbps |
| Passive Gain | 12 dB | 13 dB | N/A | 25 dB | 5 dB | 18.5 dB |
| ED Type | Active CS single-ended | Active CS fully-differential | Passive Dickson single-ended | Active CS single-ended | Passive Dickson single-ended | Active CG pseudo-balun |
| ED Power $P_{ED}$ | 23 nW | 2.4 μW | 0 | 2.1 nW | 0 | 1.8 nW |
| ED $R_{in}$@RF | 505.6 Ω | N/A | N/A | 10 kΩ* | 76.3 Ω | 30 kΩ* |
| ED Scaling Factor $k$ ($\frac{1}{V}$) | 112.2* | $1.1 \times 10^{4*}$ | N/A | 180.8 | N/A | 301.2 |
| ED Efficiency $k/P_{ED}$ ($\frac{1}{V \cdot nW}$) | 4.9* | 4.6* | N/A | 86.1 | N/A | 167.3 |
| Comparator Reference | ED replica | None | RC LPF | Reference ladder | N/A | None |
| Carrier Frequency | 915 MHz | 2.4 GHz | 2.4 GHz | 113.5 MHz | 403 MHz | 405 MHz |
| Sensitivity | −41 dBm | −50 dBm | −39 dBm / −56.5 dBm | −69 dBm | −45 dBm | −63.8 dBm |
| RX Power | 98 nW | 4.5 μW | 104 nW / 236 nW | 4.5 nW | 116 nW | 4.5 nW |

FIG. 5

LOW POWER WAKE-UP RECEIVER

PRIORITY CLAIM AND REFERENCE TO RELATED APPLICATION

The application claims priority under 35 U.S.C. § 119 and from all applicable statutes and treaties from prior provisional application Ser. No. 62/588,038 which was filed Nov. 17, 2017.

STATEMENT OF GOVERNMENT INTEREST

This invention was made with government support under contract No. HR0011-15-C-0134 awarded by Defense Advanced Research Projects Agency (DARPA). The government has certain rights in the invention.

FIELD

A field of the invention is wireless networks. Embodiments of the invention particularly concern low-power wake-up receivers for monitoring a wireless, e.g., radio-frequency (RF), environment.

BACKGROUND

Low-power wide-area networks are a key component of future smart cities where infrastructure will be connected via an Internet of Everything. For such networks to function, a large number of connected devices in the network (e.g., smart meters, environmental sensors, and threat monitors) must operate for years from small batteries or energy harvesters, e.g., solar cells, and communicate over long distances that defined the network. This necessitates inclusion of ultralow power radios with high sensitivity—two parameters that embody conflicting goals.

Average device power can be reduced in event-driven networks with low-average throughput by replacing energy expensive synchronization routines of a main radio of a node in the network with a low power, always-on wake-up receiver (WuRX). Such wake-up receivers continuously monitor a radio-frequency (RF) environment for infrequent event-driven wake-up signals. WuRXs that can reduce power demands to nanowatt (nW) power are known (e.g., see references [1]-[3], listed below), however such WuRXs have had moderate sensitivity. The moderate sensitivity is appropriate for certain low average-throughput applications, e.g., wearable temperature sensors or environmental monitors, which tolerate wake-up latency and relaxed data rates.

Some works in the art have exploited such requirements to design low-bandwidth, and therefore low-noise, on-off keying (OOK) WuRXs that, along with a passive RF gain transformer filter, achieved excellent sensitivity at nW power levels [4]. However, such works were limited to a carrier frequency of 113.5 MHz, largely because of the low input impedance of the envelope detector (ED). While a low carrier frequency may be suitable for some applications, such as unattended ground sensor networks, it is not practical for other applications such as but not limited to many wearable and Internet of Things (IoT) applications.

REFERENCES

[1]. N. E. Roberts and D. D. Wentzloff, "A 98 nW wake-up radio for wireless body area networks," in RFIC Symp., June 2012, pp. 373-376.

[2]. S. Oh et al., "A 116 nW multi-band wake-up receiver with 31-bit correlator and interference rejection," in Proc. CICC, September 2013.

[3]. N. E. Roberts et al., "A 236 nW −56.5 dBm-sensitivity bluetooth low-energy wakeup receiver with energy harvesting in 65 nm CMOS," in ISSCC Dig. Tech. Papers, February 2016, pp. 450-451.

[4]. H. Jiang et al., "A 4.5 nW Wake-Up Radio with −69 dBm Sensitivity," in ISSCC Dig. Tech. Papers, February 2017, pp. 416-417.

[5]. S.-E. Chen et al., "A 4.5 µW 2.4 GHz Wake-Up Receiver Based on Complementary Current-Reuse RF Detector," in Proc. ISCAS, May 2015, pp. 1214-1217.

[6]. X. Huang et al., "Noise and sensitivity in RF envelope detection receivers," IEEE Trans. Circuits Syst. II, Exp. Briefs, vol. 60, no. 10, pp. 637-641 October 2013.

SUMMARY OF THE INVENTION

A preferred embodiment provides a low-power wake-up receiver. The receiver includes a transformer/filter resonating at a pre-selected frequency to realize passive RF voltage gain. A pseudo-balun envelope detector is coupled to an output of the transformer filter. A comparator or other quantizer is coupled to an output of the active pseudo-balun envelope detector (ED) for comparing the ED output to a comparison threshold voltage. In a preferred embodiment, the pseudo-balun envelop detector is an active detector. In another preferred embodiment, the pseudo-balun detector is a passive detector.

A clock for the receiver is preferably provided by a temperature compensated relaxation oscillator. The relaxation oscillator preferably includes a proportional to absolute temperature (PTAT) reference current generator that charges an integration capacitor $C_{int}$ charged by the reference current to generate a reference voltage $V_{ref}$, and a continuous-time comparator with a complementary to absolute temperature (CTAT) delay that resets the integration capacitor repeatedly after $V_{int}$ crosses $V_{ref}$ realizing a temperature independent frequency.

BRIEF DESCRIPTION OF THE DRAWINGS

FIG. 5 is a table showing a performance comparison of state-of-the-art sub-10 µW WuRXs;

DESCRIPTION OF THE PREFERRED EMBODIMENTS

Example wake-up receivers according to embodiments of the invention can provide, among other benefits, a highly networked environment where extremely low power (sub-uW) electronics are necessary for battery life and cost. The high-power consumption of conventional wireless, e.g., radio, receivers often dictates the battery life of, for instance, small Internet of Things (IoT)-like devices. To reduce the power consumption of such devices and other devices, wake-up receivers (WuRXs) can be used to monitor the RF environment and wake-up a high-performance (and typically high power) conventional radio upon the reception of a predetermined wake-up packet.

To enable operation at higher frequencies without significantly compromising sensitivity or power consumption, an example embodiment of the invention provides a WuRX featuring an active pseudo-balun envelope detector (ED). The pseudo-balun envelop detector has higher input resistance, lower input capacitance, and higher conversion gain via a current re-use common gate (CG) architecture than the state-of-the-art discussed in the background. One example application facilitates the design of a high passive gain RF transformer filter at 400 MHz.

Example embodiments will now be discussed to illustrate the invention. Artisans will appreciate broader aspects of the invention from the example embodiments.

Figure 1:
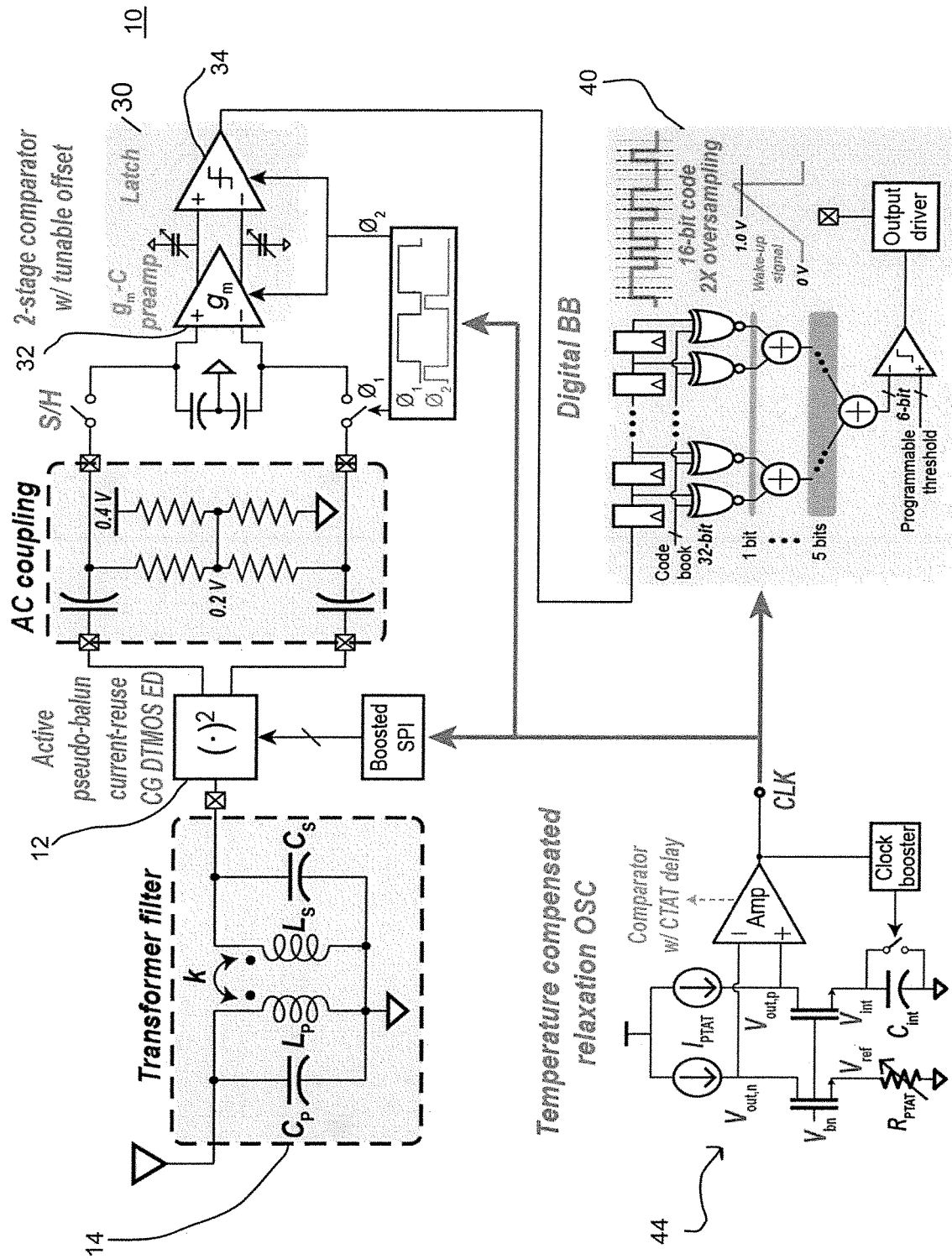
FIG. 1 is a block diagram showing an example architecture of a wake-up receiver (WuRX) according to an embodiment of the present invention.

A preferred embodiment WuRX system architecture 10 is shown in FIG. 1. To eliminate the power-hungry local oscillator (LO) in conventional radios, a direct envelope detection architecture is implemented where the RF signal is directly demodulated via the 2nd order non-linearity of an envelope detector. The example illustrated embodiment provides high sensitivity at 400 MHz without sacrificing the very low power consumption.

Transformer & Pseudo-Balun Envelope Detector

A 400 MHz high-Q transformer 14 improves sensitivity and interferer rejection Both the primary and secondary stages resonate at the same center frequency, providing filtering and performing the impedance transformation, which results in a passive voltage gain, $A_v$=18.5 dB. The passive voltage gain is limited by the effective parallel resistance of secondary coil $L_S(R_{S,P})$ and the ED input resistance ($R_{in}$). Since $R_{S,P} \approx \omega LQ$ larger inductors can achieve larger $R_S$; however, to maintain high gain via resonance at 400 MHz with a large inductor, a small ED input capacitance is required. For example, the transformer 14 can utilize $L_s$=65 nH and $L_s$=50 nH necessitating $C_{in,ED}$<3. Unfortunately, this conflicts with the desire to size the ED transistors large enough to minimize the effect of 1/f noise at baseband given the low data rate of the WuRX (300 bps). Prior work, which utilized a dynamic threshold (DTMOS) common source (CS) ED [4], had significant $C_{gd}$ and $C_{bd}$ (illustrated in FIG. 2A), precluding operation at 400 MHz.

Preferred embodiments of the invention overcome this operation that is precluded in the prior work. An active pseudo-balun ED 12 reduces $C_{in}$, increases $R_{in}$, and improves the ED scaling factor, k, compared to prior work via a current re-use pseudo-differential CG DTMOS architecture. As illustrated in FIG. 2A, compared to a CS (common source) ED, the CG (common gate) ED only has the source connected to the RF input whereas both the gate and bulk nodes are connected to a DC bias voltage, which eliminates the effects of $C_{gd}$ and $C_{bd}$ on the input. This configuration reduces input capacitance by 47.5% in simulation while maintaining the 16% 2nd order transconductance improvement of a DTMOS CS design. At nA current levels, the input resistance of a CG design is comparable with its CS counterpart and is larger than a CS amplifier with DTMOS configuration because of the elimination of the bulk connection to the input. The new nW ED achieves $R_{in}$<30 kΩ at 400 MHz in simulation. Moreover, the DC bias voltages for the gate and bulk nodes can be set at different potentials for threshold voltage adjustment and freedom of transistor sizing, whereas for a CS architecture an additional off-chip capacitor and bias resistors are required, leading to extra input capacitance and a noise penalty.

Conventional single-ended EDs need either a reference ladder [4] or replica ED [1] to serve as the comparator reference voltage, which require power overhead and/or PVT (process voltage and temperature) tuning. Using an RC low-pass filter at the ED output as a dynamic reference is another solution, but at the expense of degraded SNR due to the pulsed nature of the baseband signal. With the present pseudo-balun ED, two n- and p-type CG amplifiers 20, 22 are stacked in a current re-use structure (FIG. 2B) with impedance 23 to provide single-ended to pseudo-differential conversion, eliminating the need of an explicit reference. Interestingly, the preferred ED acts as a pseudo-balun only to 2nd order non-linearities: linear RF currents flow symmetrically through the n- and p-CG amplifiers to partially cancel at the outputs (and are then further filtered), yet the baseband 2nd order components flow pseudo-differentially with slightly different gains due to the asymmetric loading. Compared to a fully (pseudo)-differential CS design [5], the present pseudo-balun ED's input is inherently an AC ground because of the transformer and thus no bias circuits (with their additional parasitic capacitance) are required at the input. Furthermore, the current re-use pseudo-differential architecture improves the ED scaling factor, k, by 66.6% compared to [4], and the WuRX sensitivity by 1.5 dB without a power penalty.

Figure 2B:
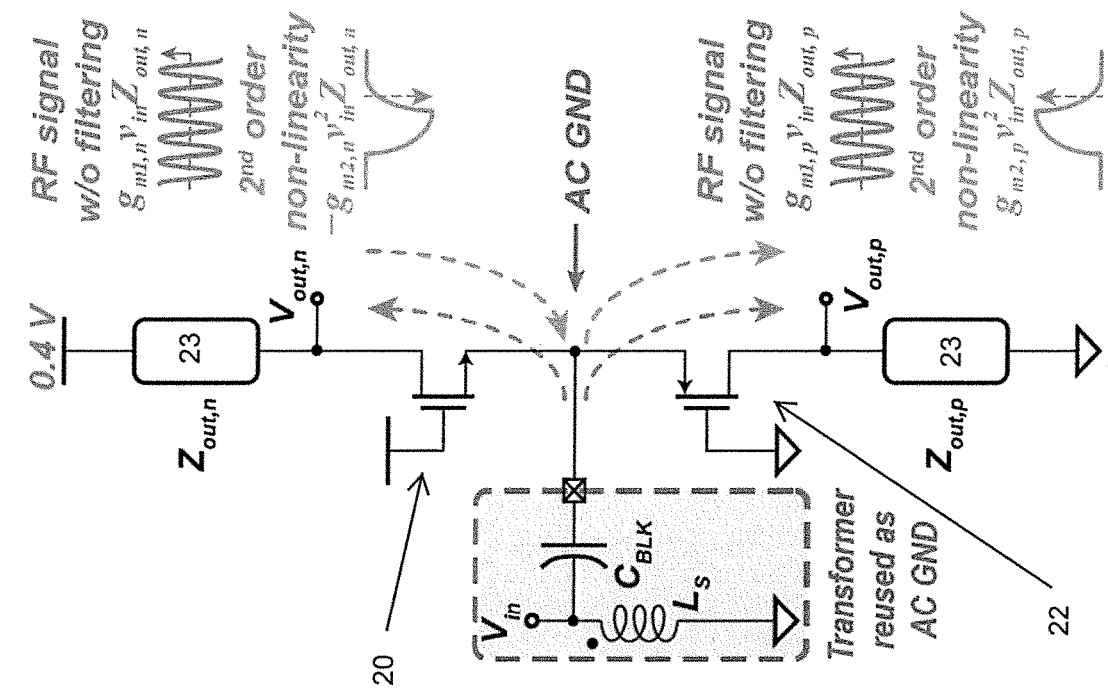
FIGS. 2A and 2B show, respectively, a comparison of dynamic threshold voltage MOSFET (DTMOS) common source architecture (DTMOS CS) and common gate architecture envelope detectors (CG-EDs) according to an embodiment of the present invention (FIG. 2A), and an active pseudo-balun current-reuse CG ED operation according to an embodiment of the present invention (FIG. 2B)
Figure 2A:
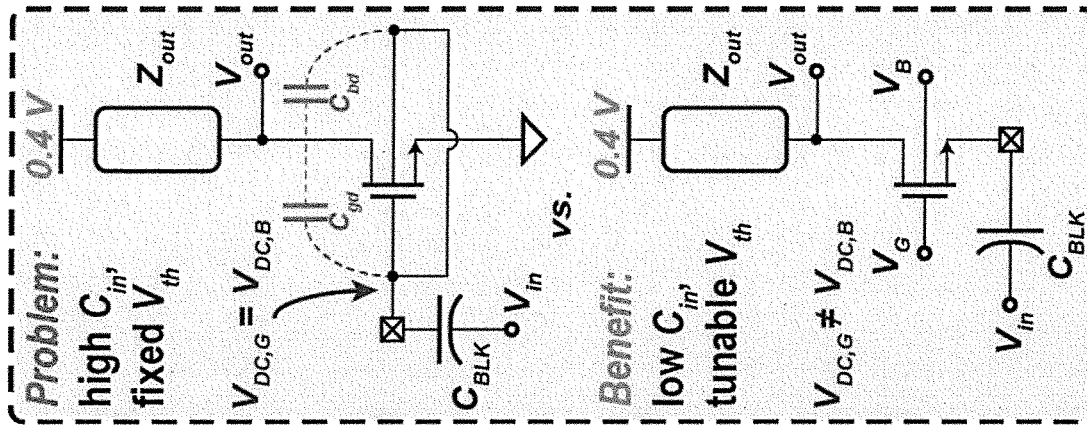
Figure 3:
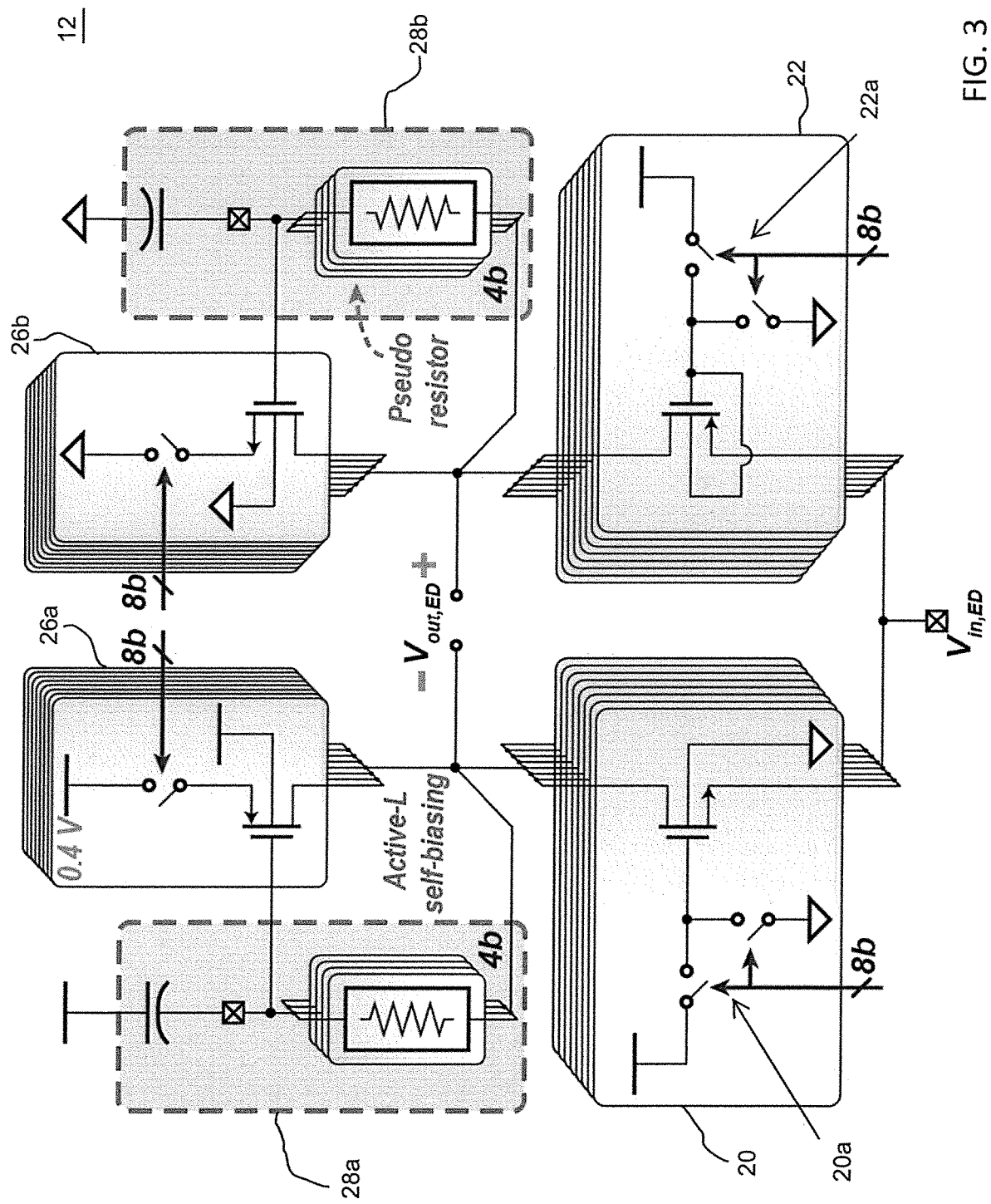
FIG. 3 schematically shows an example active pseudo-balun current-reuse CG DTMOS ED according to an embodiment of the present invention.

A preferred embodiment of the FIG. 2B pseudo-balun envelope detector is shown in FIG. 3, where input transistors 20, 22 are NMOS and PMOS transistors implemented with tunable width via eight bit selector switches 20a 22a in order to overcome process variation, and the load comprises self-biased PMOS or NMOS transistors 26a, 26b (implement the impedance 23 of FIG. 2B) connected in feedback to the output via MOS-bipolar pseudoresistors 28a, 28b for an active-L-like bias. The load transistors 26a and 26b and pseudo resistors are preferably digitally adjustable to ensure proper biasing can be achieved regardless of process voltage and temperature variation. The preferred pseudo-balun envelope detector is shown in FIG. 3 and uses an active-inductor bias technique with the MOS-bipolar pseudo-resistor 28a, 28b feedback in the load circuits to increase output impedance and therefore k. To overcome process variation, preferably all transistors 20, 22, 26a and 26b have 8 b of tunability while the pseudo-resistor cells 28a and 28b have 4 bits of tunabilitiy Baseband Circuitry and Coding Referring again to FIG. 1, to overcome clock asynchronization, the example ED 12 output is band-pass filtered, 2× oversampled, and digitized by a two-stage comparator 30, which preferably includes a dynamic $g_m$-C preamplifier 32 and a regenerative latch 34 for low input-referred noise. A comparison threshold voltage is programmed via two 6 its (for example) capacitor DACs that also tune out the preamplifier offset voltage. Due to the unbalanced output impedances from the example pseudo-balun ED 12, a sample and hold (S/H) circuit is provided to store the dynamic comparator kickback charge and provide balanced impedances. The comparator output is then processed by a 32-bit (for example) digital correlator 40 to compute correlation against a programmable codebook. Once the value exceeds a predefined threshold, a charge pump generates a 1.2 V signal to indicate wake-up. The example 16 bit signature sequence preferably achieves the optimal Hamming distance from all of its shifted versions and from the all-0 sequence.

Relaxation Oscillator

A stable clock is provided for (preferably) the whole system 10 by a 1.14 nW temperature-insensitive comparator-based relaxation oscillator 44. The supply voltage can be too low to turn on/off the switches effectively. A clock booster boosts voltage, e.g., doubler/tripler/etc. on the output of the clock such that it has a higher voltage than the supply. A proportional to absolute temperature (PTAT) reference current is generated to charge an integration capacitor $C_{int}$ and generate a reference voltage $V_{ref}$. A two-stage continuous-time comparator resets the integration capacitor repeatedly after $V_{int}$ crosses $V_{ref}$.

Compared to conventional comparator-based oscillators, where the RC is trimmed to have a low-temperature coefficient and the comparator is designed with high bandwidth and negligible delay, the preferred embodiment oscillator 44 uses a PTAT current to bias the two-stage comparator with a well-controlled complementary to absolute temperature (CTAT) delay. This CTAT delay along with the intentional PTAT RC integration time cancel to realize a periodic pattern with a temperature coefficient less than 94 PPM/° C. Since the comparator bandwidth requirement is greatly relaxed, this technique results in high power efficiency (0.94 nW/kHz).

Figure 4A:
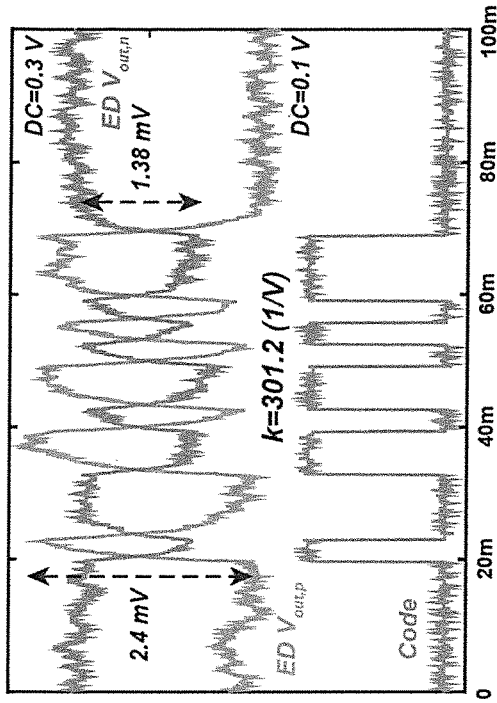
FIGS. 4A-4D are graphs showing, respectively: S11 measurement (FIG. 4A), envelope detector (ED) output transient waveform (FIG. 4B), missed detection rate vs. input signal power (FIG. 4C), and interferer power versus frequency (FIG. 4D)
Figure 4B:
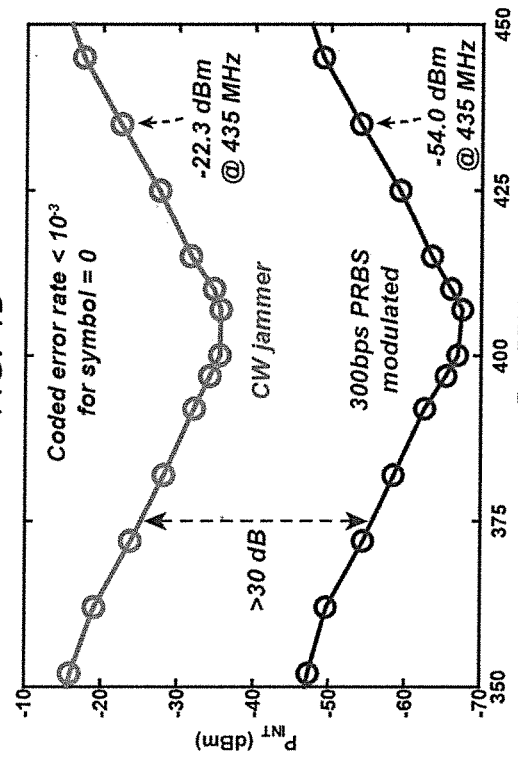
Figure 4C:
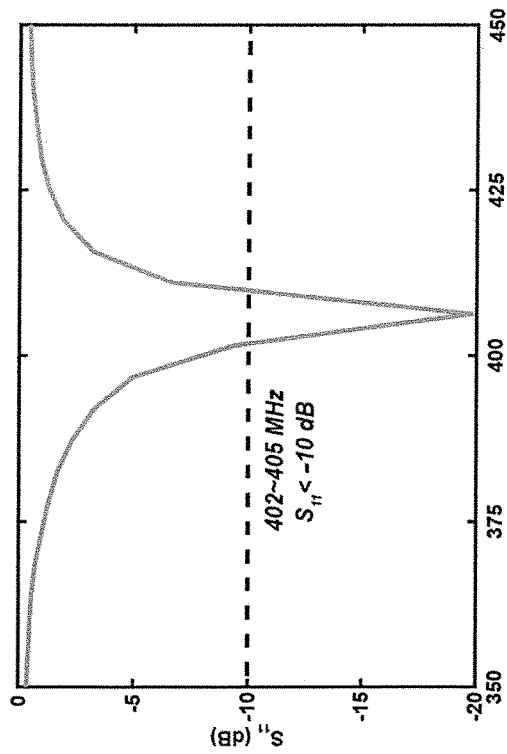

An example MICS-band WuRX according to FIG. 1 was measured. As shown in FIG. 4A, the measured S11 is <−10 dB, indicating good input matching across the 402-405 MHz MICS band. Transient waveforms from the 1.8 nW ED when the coded OOK signal is received are shown in FIG. 4B, illustrating the pseudo-differential operation. The measured ED scaling factor $k_{ED}$ is 301.2 (1/V). From the missed detection rate waterfall curve, the example WuRX achieves a sensitivity of −63.8 dBm when the threshold is set to have a false alarm rate of <1/hr (FIG. 4C). The measured passive voltage gain of the example 400 MHz transformer filter is 18.5 dB.

Figure 4D:
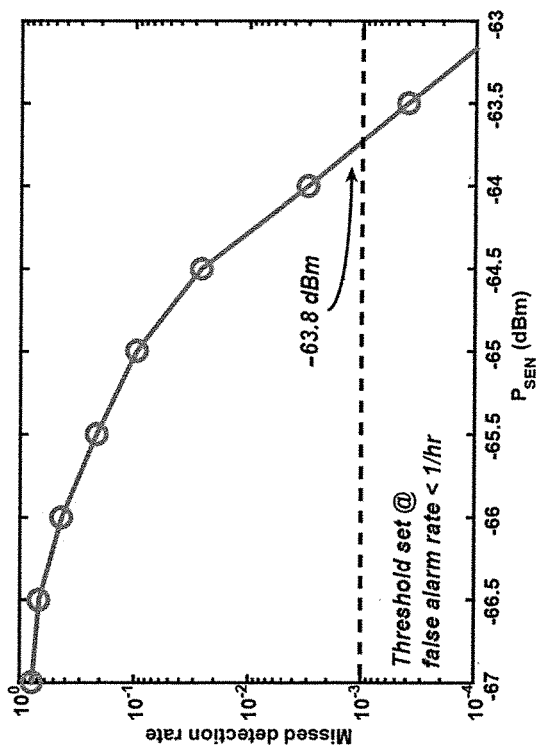
Figure 6:
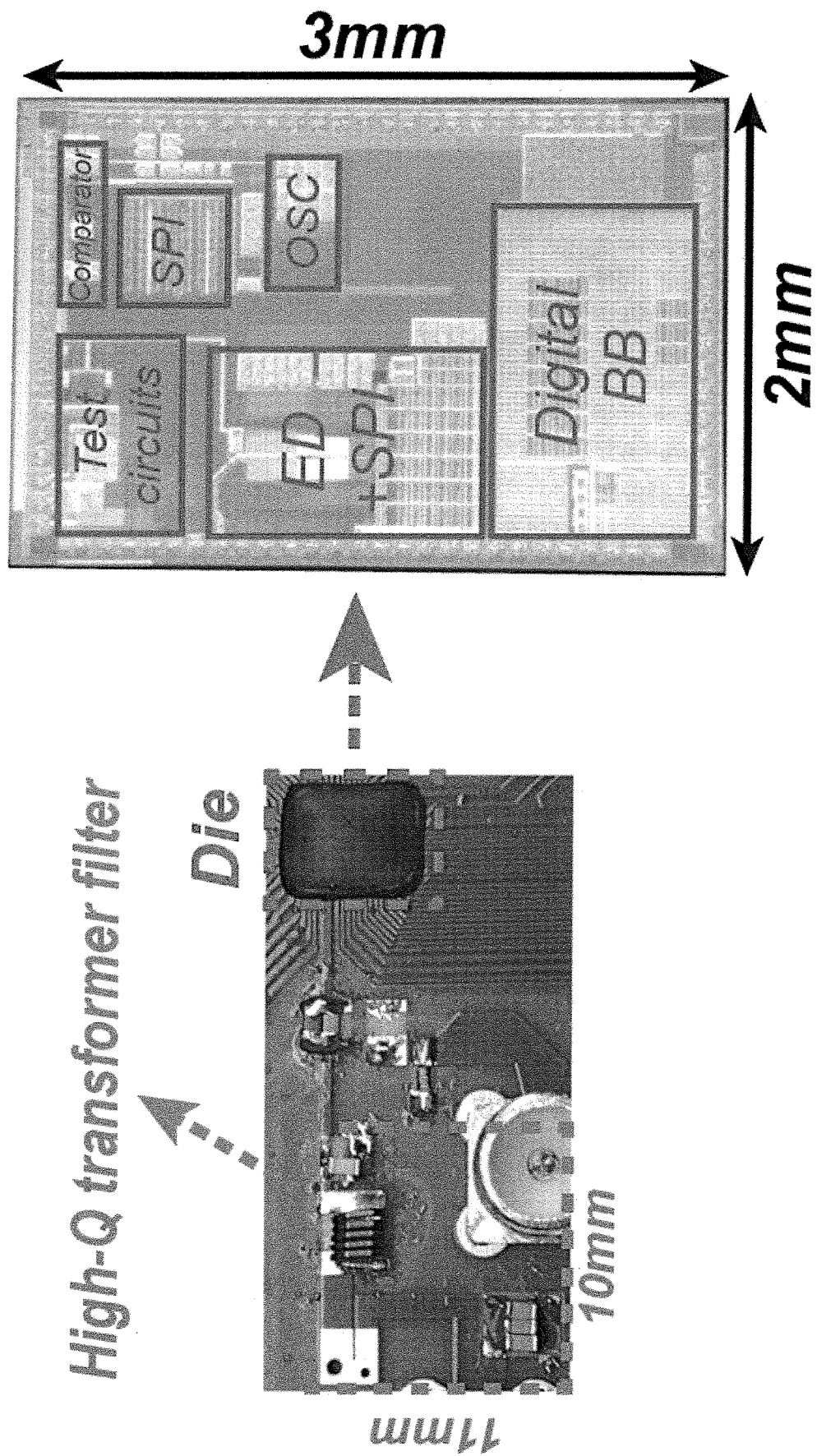
FIG. 6 shows an example board and die for a high-Q transformer filter according to an embodiment of the invention.

Compared to the design of [4] with 25 dB passive voltage gain at 113.5 MHz and −69 dBm sensitivity, an additional ~1.5 dB improvement in sensitivity was achieved from the example pseudo-balun ED. The example high-Q transformer filter also helps to block unwanted interferers, as the example WuRX was measured to tolerate >−50 dBm 300 bps pseudo-random binary sequence (PRBS) modulated jammers, and >−20 dBm higher modulation frequency/continuous wave jammers at a 50 MHz offset without adversely affecting performance as shown in FIG. 4D Table I (FIG. 5) summarizes the measurement results of the example WuRX and compares the results to the state-of-the-art sub-10 µW WuRXs. To compare prior ED designs with different power consumption, the ED efficiency $k_{ED}$/PED is computed, and the example ED achieves the highest efficiency. An example WuRX chip was fabricated in 0.18 µm CMOS SOI process and directly bonded to a PCB-mounted 400 MHz transformer filter, as shown in FIG. 6. To compare to prior work using direct envelope detection architecture with different data rate and therefore, baseband bandwidth, $BW_{BB}$, the normalized sensitivity can be computed as:

$$P_{SEN,norm}(dB) = P_{SEN} - 5 \log BW_{BB}, \qquad (1)$$

where $P_{SEN}$ is sensitivity in dBm, and $5 \log BW_{BB}$ is used to account for the non-linear squaring nature of EDs [6]. Moreover, considering power consumption, with equation (1) the following figure of merit (FoM) is derived:

$$\text{FoM (dB)} = -P_{SEN,norm} - 10\log\frac{P_{DC}}{1 \text{ mW}}, \qquad (2)$$

Figure 7:
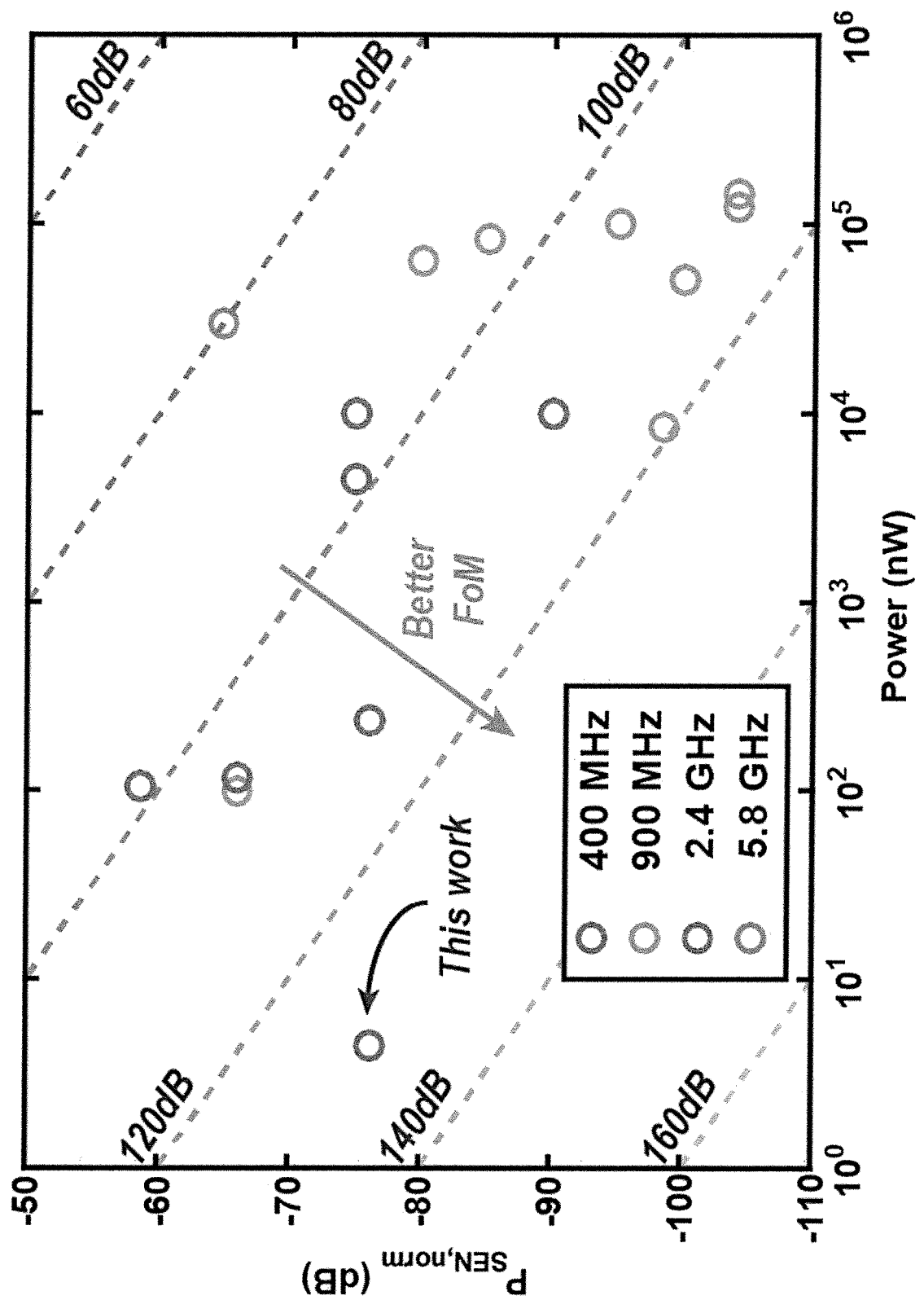
FIG. 7 is a graph showing normalized sensitivity versus power landscape with figure of merit (FoM) contours for >400 MHz WuRXs using direct envelope detection architecture.

A landscape of $P_{SEN,norm}$ vs. power along with FoM contours for previously disclosed >400 MHz WuRXs using direct envelope detection architecture is shown in FIG. 7, illustrating that the example WuRX achieves the highest FoM (129.7 dB) amongst known prior devices through a combination of excellent sensitivity (−63.8 dBm) and ultra-low power (4.5 nW), all at a practical frequency of 400 MHz.

Preferred embodiment devices have a number of applications. Example wake-up devices can consume 20-100 times lower power compared to conventional wake-up devices without sacrificing sensitivity. Such devices are particularly suitable for use for infrequent event monitoring but can be used for other applications as well. Devices can be used individually or as part of wireless networks. Low power wake-up receivers can be used in or with, for instance, wireless devices or networks for monitoring or sensing, wireless communication devices or networks, devices or networks for therapeutics, diagnostics, research, etc., or can be used as standalone devices or networks. Particular example applications include low-power or near-zero-power wireless devices and networks, wearable wireless devices and networks, Internet of Things (IoT) devices and networks, etc.

Passive Pseudo-Balun Envelope Detector

The above embodiments demonstrate that a combination of low carrier frequency operation (i.e., FM-band) and reduced WuRX data rate, large passive RF voltage gain (at the expense of larger passive components) when combined with high input impedance active ED results in improved sensitivity (compared to the art discussed in the background) at extremely low power (e.g., −69 dBm at 4.5 nW), with wake-up latencies that still support the needs of low-average throughput applications. However, sensitivity still lags that of many main radios. An additional embodiment uses a passive pseudo-balun ED with bulk tuning unit cell further improves the sensitivity.

In the above embodiments, which provide a significant advance over the prior state-of-the-art, the active pseudo-balun envelope detector 12 is the dominant noise source. A modified embodiment with a passive pseudo-balun envelope detector eliminates the 1/f noise of the active pseudo-balun envelope detector 12. A particular modified embodiment provides high sensitivity −80.5 dBm sensitivity with only 6.1 nW. The passive pseudo-balun envelope detector topology provides single-ended to differential conversion to improve the conversion gain by 2× than if a single-ended passive envelope detector was used for a given capacitance and a given input signal level. Preferred embodiments that use a passive-balun ED use higher $V_t$ devices than artisans would consider for a single-ended passive ED [1] to increase the effective input resistance as well, and as a body-biasing technique to reduce the input capacitance, which enables the design of a passive voltage gain impedance transformer with 30.6 dB gain. As in the above embodiments, the asymmetric pseudo-resistor cells 28a, 28b of the current-reuse CG amplifiers 20, 22 increase amplifier impedance but avoid unduly increasing start-up time.

Figure 8:
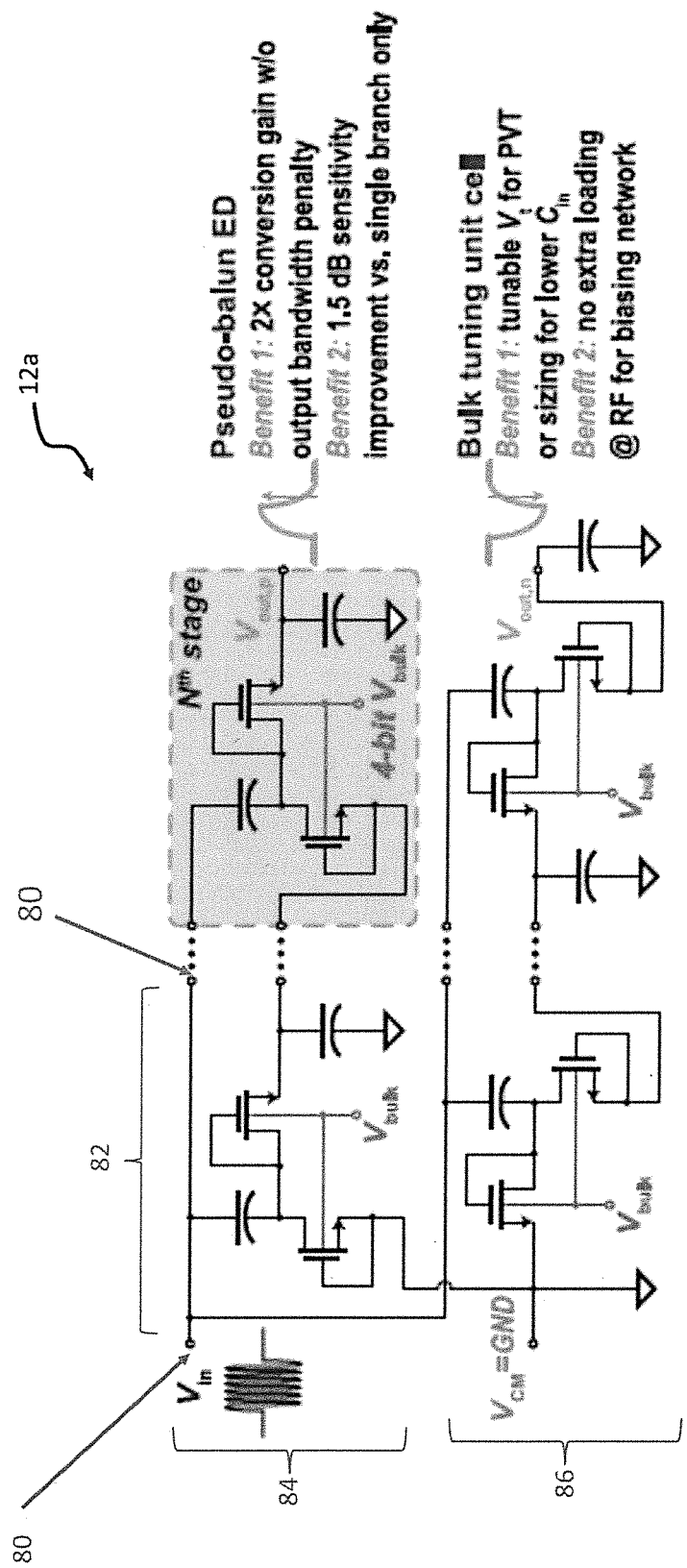
FIG. 8 illustrates a preferred passive pseudo-balun envelope detector for a modified embodiment of FIG. 1.

The passive pseudo-balun envelope detector 12a replaces the active pseudo-balun detector 12 of FIG. 1 and FIG. 3, and the envelope detector 12a is shown in FIG. 8. The overall architecture is similar to the active approach, but in this case using passive diode-connected transistors. Then, multiple sets of diode-connected transistors are configured in a cascade according to a Dickson charge-pump-like structure. The advantage of this approach is that power consumption is zero, and there is no 1/f noise since there are no DC bias currents. Vin is received at an input node 80, which is also connected to the second stage coil of the transformer filter. An envelope detector cell 82 provides the envelope function for the input signal. The pseudo balun is formed by the combination of a top branch 84 and bottom branch 86. The tunable passive pseudo-balun ED architecture 12a is a N-stage rectifier with the middle node connected to $V_{CM}$ (common mode voltage) and the bulk nodes connected to a tunable voltage, Vbulk, to set the bandwidth. As such, the baseband ac currents flow in opposite directions relative to ground to form a pseudo-differential output $V_{out,p}$, $V_{out,n}$. Compared to a single-branch N-stage Dickson rectifier, this passive ED 12a achieves 2× conversion gain and a 1.5-dB sensitivity improvement under the same input signal level without sacrificing output bandwidth. Although the second branch (bottom half of rectifier 86) of the N-stage ED could be connected in parallel with the first branch (top half of rectifier 84) without flipping the polarity, this results in the same 1.5-dB improvement in sensitivity, but only half of the conversion gain and is single-ended. $V_{bulk}$ is provided by a diode-connected reference ladder (unshown) with 4-bit tunability.

An envelope detector with a larger number of stages, N, requires large transistor widths and has a larger input capacitance to maintain a given output bandwidth, which limits transformer gain. Parasitic capacitance increases with transistor width, adding to the capacitive load at the output and requiring a decrease in output resistance. We have developed an objective function to compare designs with different N under the same output bandwidth and operating frequency, which is:

$$SNR_{ED,norm} = \frac{A_v^2 \cdot k_{ED}}{\sqrt{V_n^2}} \cdot 10^{-9} \quad (3)$$

In the objective function (3), $A_V$ is the transformer passive voltage gain. $K_{ED}$ is a scaling factor that is proportional to the number of stages N. The total integrated noise is $\sqrt{V_n^2}$. The objective function is essentially the achievable ED output SNR normalized to its 132 input voltage, and a preferred optimum value is N=5. The bulk tuning can also effectively reduce input capacitance via smaller devices for an equivalent output bandwidth and can therefore maximize the achievable passive voltage gain at a given carrier frequency. Forward biasing the bulk-to-source junction diode ($V_{bulk}$) (e.g., <200 mV), Vt is reduced and allows smaller width transistors to be implemented for a given output bandwidth (e.g., 33.3 Hz in an experimental example). The passive pseudo-balun ED 12a can be implement in pMOS devices in a process without a deep N-well, but an experimental example was implemented in nMOS is to leverage higher mobility and thus lower transistor size for a given output bandwidth.

Baseband Circuitry and Coding with the Passive Pseudo-Balun ED

Figures 9A, 9B:
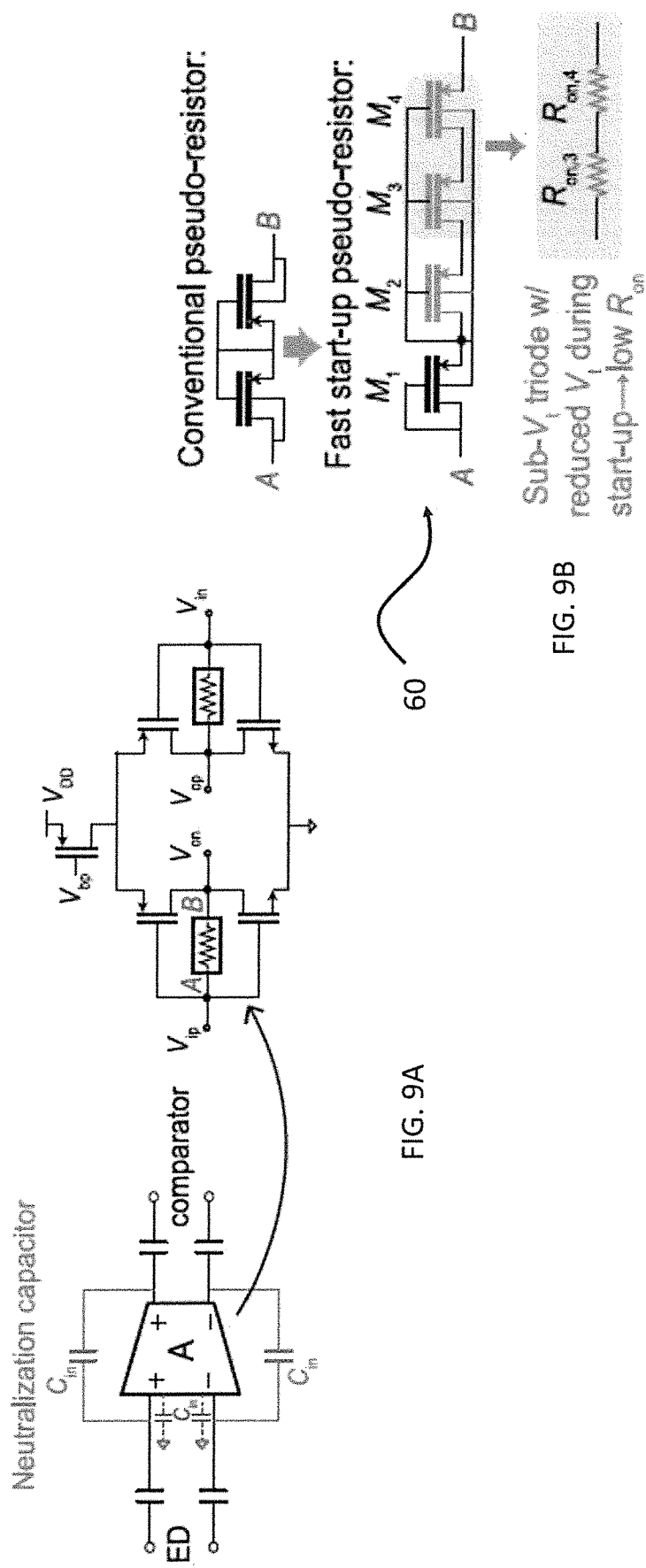
FIGS. 9A and 9B illustrate a preferred baseband amplifier and pseudo resistor for the modified embodiment.

With the passive ED 12a, more power can be devoted to the baseband amplifier to thereby minimize its noise. A preferred continuous-time amplifier is shown in FIG. 9A, and includes a self-biased, inverter-based configuration. $V_{in}$ and $V_{out}$ are ac-coupled to remove dc offset. Because of the large ED output impedance (>1 GΩ), the amplifier input capacitance is set low enough to maintain the baseband bandwidth while also balancing the 1/f noise. In an example experimental embodiment, neutralization capacitors were used to mitigate the Miller effect and reduce input capacitance from 12 to 0.4 pF. To avoid degrading the ED gain, pseudo-resistors are preferably >1 TΩ. If a conventional pseudo-resistor is used, this can lead to a long start-up time (>40 s), which may not be acceptable in some application. FIG. 9B, shows a preferred fast start-up pseudo-resistor. This pseudo-resistor 60 is asymmetric (such as by different sizing and/or topography) and leverages a high nonlinear voltage dependence. When the supply is ramping up, node B is rapidly pulled to $V_{DD}$, while node A (without a dc path to the supply) remains near ground. This drives M3-M4 into subthreshold triode operation with a reduced $V_t$ ($V_{SG}=V_{SB}\sim V_{DD}/2$ and $V_{SD}\sim 0$) and thereby provides loser dc resistance (50× lower than the conventional pseudo-resistor) which substantially speeds start-up by 12×. Once $V_{SG}$ and $V_{SB}$ approach zero, the pseudo resistor 60 returns to a high resistance state so it does not adversely affect small-signal resistance.

The output of the baseband amplifier can be digitized, by a suitable converter including as in FIG. 1 via a comparator. In a preferred implementation, a 36-bit digital correlator is implemented using logic cells and computes the Hamming distance between the incoming code and a programmable code. The 200-Hz clock for the comparator and digital correlator can be generated by a relaxation oscillator consuming only 520 pW. To overcome phase asynchronization, the baseband signal can be oversampled by 6×, and the designed pattern provides 2.5-dB coding gain. The preferred embodiment with the passive pseudo-balun and fast start-up pseudo resistor improves further on the performance tabulated in FIG. 5 compared to the active pseudo-balun embodiment of FIG. 3. In particular, the modified embodiment provides 30.6 dB of passive RF voltage gain, with a wake-up latency of 180 ns and sensitivity of −80.5 dBm, and power consumption of 6.1 nW.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A low-power wake-up receiver comprising:
a transformer/filter resonating at a pre-selected frequency to realize passive RF voltage gain;
an active pseudo-balun envelope detector coupled to an output of the transformer filter;
a comparator or a quantizer coupled to an output of the active pseudo-balun envelope detector (ED) for comparing the ED output to a comparison threshold voltage, wherein the quantizer digitizes the ED output; and
wherein the receiver further comprises:
a digital correlator configured to process an output of the comparator to compute correlation of the comparator output and determine a value based on the computed correlation; wherein the receiver further comprises:
a charge pump configured to generate a signal if the determined value exceeds a pre-defined threshold.

2. A low-power wake-up receiver comprising:
a transformer/filter resonating at a pre-selected frequency to realize passive RF voltage gain;
an active pseudo-balun envelope detector coupled to an output of the transformer filter;
a comparator or a quantizer coupled to an output of the active pseudo-balun envelope detector (ED) for comparing the ED output to a comparison threshold voltage, wherein the quantizer digitizes the ED output, wherein the active pseudo-balun envelope detector comprises common gate (CG) amplifiers stacked in a current re-use structure.

3. The receiver of claim 2,
wherein the quantizer digitizes the ED output; and
wherein the receiver further comprises:
a digital correlator configured to process an output of the comparator to compute correlation of the comparator output and determine a value based on the computed correlation.

4. The receiver of claim 2, wherein the active pseudo-balun envelop detector comprises input transistors and self-biased load transistors connected in feedback to the ED output via bipolar pseudo-resistors.

5. The receiver of claim 4, wherein the input transistors, load transistors and pseudo-resistors are digitally adjustable to allow biasing that accounts for process voltage and temperature variation.

6. The receiver of claim 2, wherein the receiver further comprises:
an amplifier disposed between the envelope detector and the comparator or other quantizer.

7. The receiver of claim 6, wherein the pseudo-balun envelope detector permits linear RF currents flow symmetrically and only provides the pseudo-differential conversion for 2nd order non-linearities.

8. The receiver of claim 2, wherein the pseudo-balun envelope detector provides a single-ended to pseudo-differential conversion.

9. The receiver of claim 2, comprising no bias circuits at an input of the receiver.

10. The receiver of claim 2, comprising a relaxation oscillator providing a clock for the receiver, wherein the relaxation oscillator comprising a proportional to absolute temperature (PTAT) reference current generator that charges an integration capacitor $C_{int}$ charged by the reference current to generate a reference voltage $V_{ref}$, and a continuous-time comparator with a complementary to absolute temperature (CTAT) delay that resets the integration capacitor repeatedly after $V_{int}$ crosses $V_{ref}$ realizing a temperature independent frequency.

11. The receiver of claim 2, wherein the comparator or quantizer comprises a two-stage comparator that band-pass filters, oversamples, and digitizes the ED output.

12. The receiver of claim 11, wherein the two-stage comparator comprises a preamplifier and a regenerative latch.

13. A low-power wake-up receiver comprising:
a transformer/filter resonating at a pre-selected frequency to realize passive RF voltage gain;
a passive pseudo-balun envelope detector coupled to an output of the transformer filter;
a comparator or a quantizer coupled to an output of the passive pseudo-balun envelope detector (ED) for comparing the ED output to a comparison threshold voltage, wherein the passive pseudo-balun envelop detector comprises a rectifier with a middle node connected to a common mode voltage and bulk nodes connected to a tunable voltage to set the bandwidth.

14. The receiver of claim 13, comprising a baseband amplifier having a self-biased, inverter-based configuration with input and output voltages being accoupled to remove dc offset.

15. The receiver of claim 13, comprising a relaxation oscillator providing a clock for the receiver, wherein the relaxation oscillator comprising a proportional to absolute temperature (PTAT) reference current generator that charges an integration capacitor $C_{int}$ charged by the reference current to generate a reference voltage $V_{ref}$, and a continuous-time comparator with a complementary to absolute temperature (CTAT) delay that resets the integration capacitor repeatedly after $V_{int}$ crosses $V_{ref}$ realizing a temperature independent frequency.

16. The receiver of claim 13, wherein the comparator or quantizer comprises a two-stage comparator that band-pass filters, oversamples, and digitizes the ED output.

17. The receiver of claim 16, wherein the two-stage comparator comprises a preamplifier and a regenerative latch.

18. The receiver of claim 13, wherein the passive pseudo-balun envelope detector comprises multiple sets of diode-connected transistors configured in a cascade according to a Dickson charge-pump-like structure.

* * * * *